United States Patent
Ohashi et al.

(10) Patent No.: US 9,960,174 B2
(45) Date of Patent: May 1, 2018

(54) SEMICONDUCTOR DEVICE AND METHOD FOR MANUFACTURING THE SAME

(71) Applicant: Toshiba Memory Corporation, Minato-ku (JP)

(72) Inventors: Takuo Ohashi, Kuwana (JP); Masaaki Higuchi, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 36 days.

(21) Appl. No.: 15/062,512

(22) Filed: Mar. 7, 2016

(65) Prior Publication Data
US 2017/0069647 A1    Mar. 9, 2017

Related U.S. Application Data

(60) Provisional application No. 62/216,007, filed on Sep. 9, 2015.

(51) Int. Cl.
| | | |
|---|---|---|
| H01L 27/115 | (2017.01) | |
| H01L 27/11568 | (2017.01) | |
| H01L 27/11521 | (2017.01) | |
| H01L 29/788 | (2006.01) | |
| H01L 29/792 | (2006.01) | |
| H01L 29/66 | (2006.01) | |
| H01L 29/423 | (2006.01) | |
| H01L 21/28 | (2006.01) | |

(52) U.S. Cl.
CPC .. *H01L 27/11568* (2013.01); *H01L 21/28273* (2013.01); *H01L 21/28282* (2013.01); *H01L 27/11521* (2013.01); *H01L 29/4234* (2013.01); *H01L 29/42324* (2013.01); *H01L 29/66825* (2013.01); *H01L 29/66833* (2013.01); *H01L 29/788* (2013.01); *H01L 29/792* (2013.01)

(58) Field of Classification Search
CPC ......... H01L 27/11556; H01L 27/11582; H01L 29/7889; H01L 29/7926
USPC ........................................ 257/316, 321, 324
See application file for complete search history.

(56) References Cited

U.S. PATENT DOCUMENTS

| | | | | |
|---|---|---|---|---|
| 3,878,549 | A | * 4/1975 | Yamazaki | B82Y 10/00 148/DIG. 122 |
| 4,630,086 | A | * 12/1986 | Sato | G11C 16/0433 257/316 |
| 8,247,857 | B2 | 8/2012 | Ozawa et al. | |
| 8,581,330 | B2 | 11/2013 | Kiyotoshi | |
| 8,618,603 | B2 | 12/2013 | Ozawa et al. | |
| 2013/0264624 | A1 | 10/2013 | Ishida et al. | |

* cited by examiner

*Primary Examiner* — Mark Prenty
(74) *Attorney, Agent, or Firm* — Oblon, McClelland, Maier & Neustadt, L.L.P.

(57) ABSTRACT

According to one embodiment, a semiconductor device includes a semiconductor layer; an electrode layer; a first insulating film; a charge storage film; and a second insulating film. The first insulating film is provided between the electrode layer and the semiconductor layer. The charge storage film is provided between the first insulating film and the electrode layer. The charge storage film includes a charge trapping layer and a floating electrode layer. The floating electrode layer includes doped silicon. The second insulating film is provided between the floating electrode layer and the electrode layer.

12 Claims, 14 Drawing Sheets

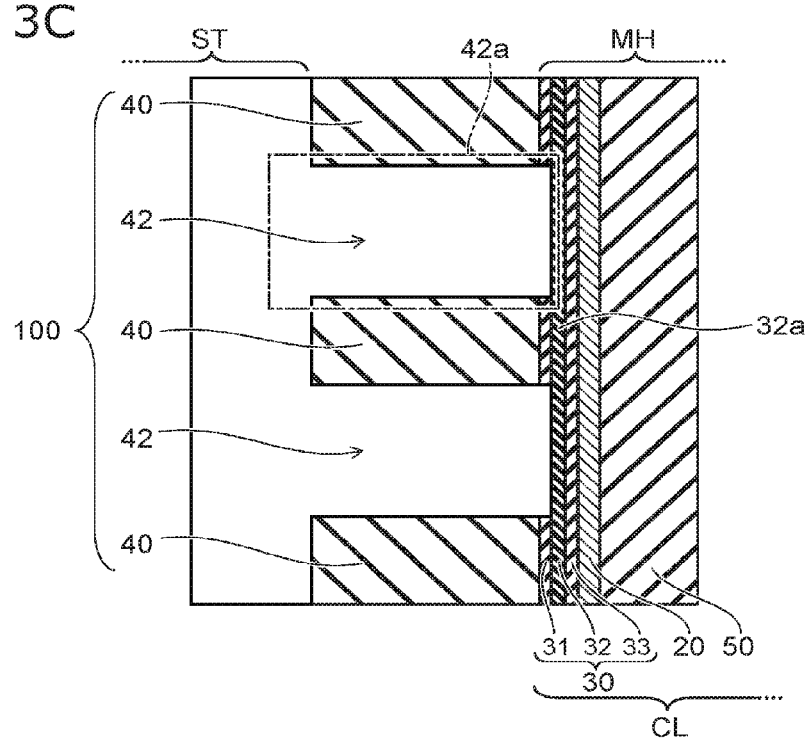
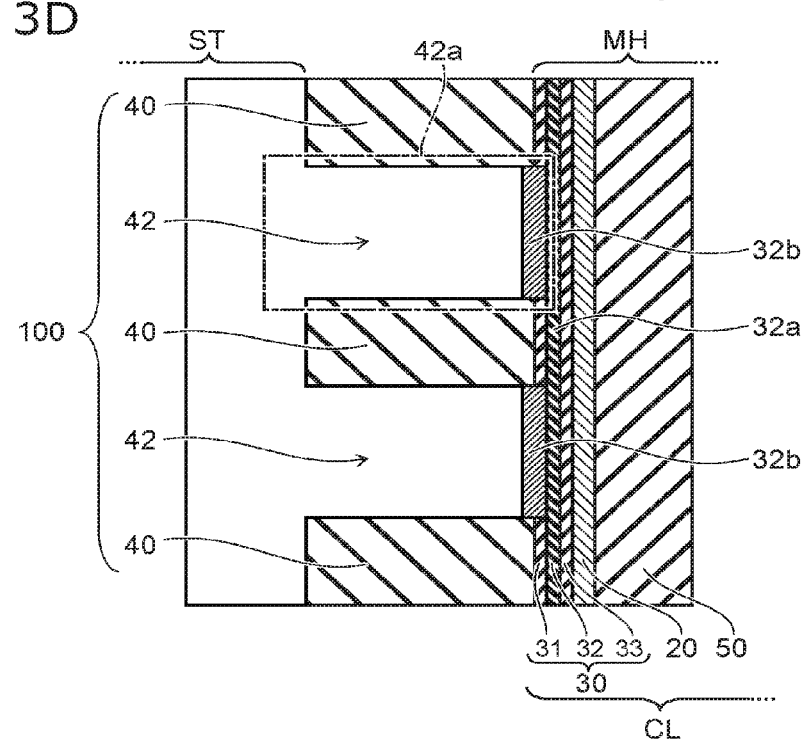

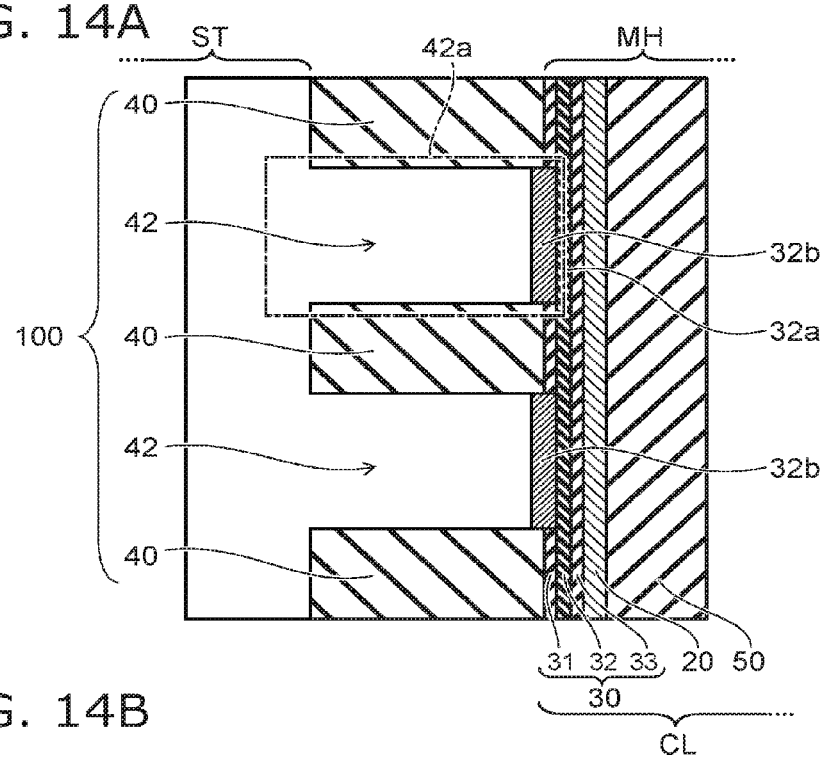
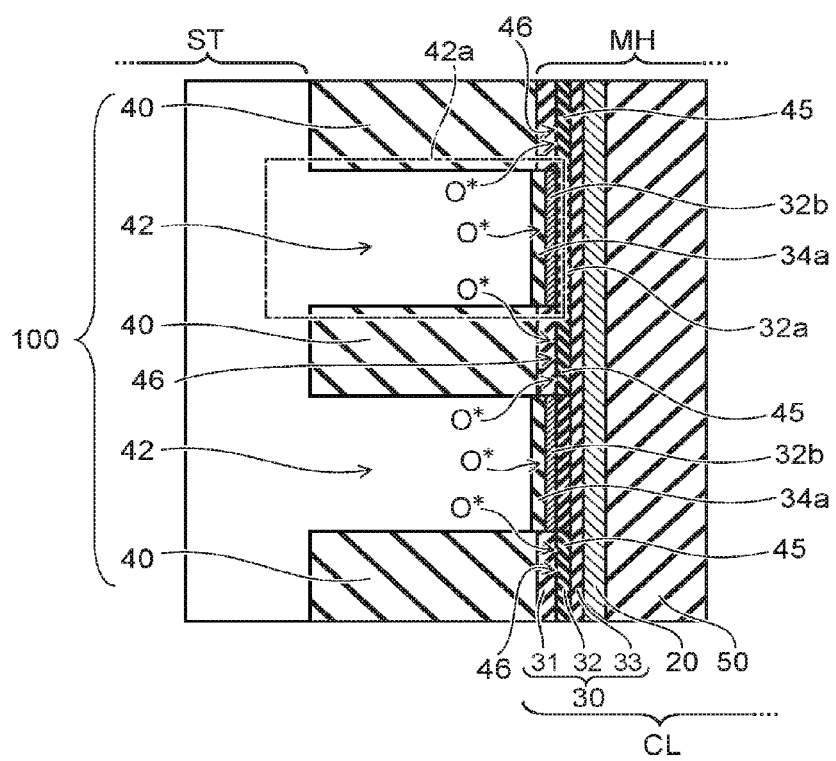

SEMICONDUCTOR DEVICE AND METHOD FOR MANUFACTURING THE SAME

CROSS-REFERENCE TO RELATED APPLICATIONS

This application is based upon and claims the benefit of priority from U.S. Provisional Patent Application 62/216,007 filed on Sep. 9, 2015; the entire contents of which are incorporated herein by reference.

FIELD

Embodiments described herein relate generally to a semiconductor device and a method for manufacturing the same.

BACKGROUND

A memory device having a three-dimensional structure has been proposed, in which memory holes are formed in a stacked body including a plurality of electrode layers that are stacked on one another, and a charge storage film and a semiconductor film are provided extending in a stacking direction of the stacked body in the memory hole. The memory device includes a plurality of memory cells that are connected in series between a drain-side select transistor and a source-side transistor. The electrode layers of the stacked body are gate electrodes of the drain-side select transistor, the source-side select transistor, and the memory cells. In order to improve the reliability and the performance of the memory device, further improvement of the electrical characteristics such as the improvement of the charge holding characteristics and writing speed of the memory cell has been demanded.

BRIEF DESCRIPTION OF THE DRAWINGS

FIG. 3A to FIG. 3H are schematic cross-sectional views showing the method for manufacturing the semiconductor device of the first embodiment;

FIG. 14A and FIG. 14B are schematic cross-sectional views showing the method for manufacturing the semiconductor device of the third embodiment;

DETAILED DESCRIPTION

Figure 1:
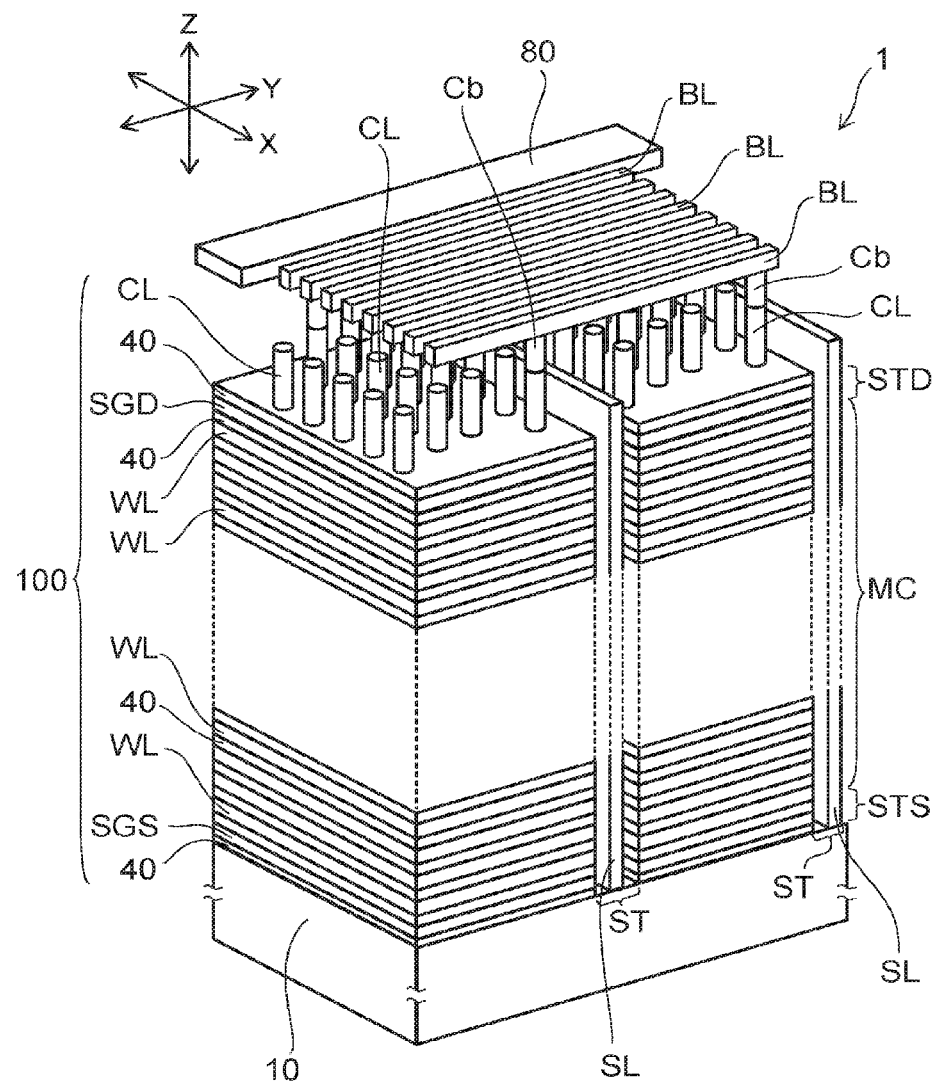
FIG. 1 is a schematic perspective view of a memory cell array of a semiconductor device of a first embodiment.

According to one embodiment, a semiconductor device includes a semiconductor layer; an electrode layer; a first insulating film; a charge storage film; and a second insulating film. The first insulating film is provided between the electrode layer and the semiconductor layer. The charge storage film is provided between the first insulating film and the electrode layer. The charge storage film includes a charge trapping layer and a floating electrode layer. The floating electrode layer includes doped silicon. The second insulating film is provided between the floating electrode layer and the electrode layer.

Embodiments will now be described with reference to the drawings. In the respective drawings, like members are labeled with like reference numerals. Semiconductor devices of the embodiments are semiconductor memory devices having memory cell arrays.

FIG. 1 is a schematic perspective view of a memory cell array 1 of a semiconductor device of a first embodiment. In FIG. 1, two directions that are parallel to the major surface of a substrate 10 and orthogonal to each other are defined as an X-direction (a first direction) and a Y-direction (a second direction), and a direction that is orthogonal to these X-direction and Y-direction is defined as a Z-direction (a third direction or a stacking direction or a vertical direction). In this specification, the "lower side" refers to a direction toward the substrate 10, and the "upper side" refers to a direction away from the substrate 10.

As shown in FIG. 1, the memory cell array 1 includes a stacked body 100, a plurality of columnar portions CL, and a plurality of dividing portions ST. The stacked body 100 includes a drain-side select gate SGD, a plurality of word lines WL, and a source-side select gate SGS.

The source-side select gate (lower gate layer) SGS is provided on the substrate 10. The substrate 10 is, for example, a semiconductor substrate. The semiconductor substrate includes, for example, silicon. The plurality of word lines WL is provided on the source-side select gate SGS. The drain-side select gate (upper gate layer) SGD is provided on the plurality of word lines WL. The drain-side select gate SGD, the plurality of word lines WL, and the source-side select gate SGS are electrode layers. A stacking number of the electrode layers is arbitrary.

The electrode layers (SGD, WL, SGS) are separately stacked on one another. An insulator 40 is disposed between the respective electrode layers (SGD, WL, SGS). The insulator 40 may be an insulating material such as a silicon oxide film or may be an air gap.

A drain-side select transistor STD uses at least one select gate SGD as a gate electrode. A source-side select transistor STS uses at least one select gate SGS as a gate electrode. A plurality of memory cells MC is connected in series between the drain-side select transistor STD and the source-side select transistor STS. Each memory cell MC uses one word line WL as a gate electrode.

The dividing portion ST is provided in the stacked body 100. The dividing portion ST spreads in the stacking direction (Z-direction) and the X-direction in the stacked body 100. The dividing portion ST divides the stacked body 100 into a plurality of regions in the Y-direction. Each region divided by the dividing portion ST is called "block".

In the dividing portion ST, a source layer SL is disposed. The source layer SL is insulated from the stacked body 100, and for example, spreads in the Z-direction and the X-direction in a plate shape. On an upper side of the source layer SL, an upper layer wiring 80 is disposed. The upper layer wiring 80 extends in the Y-direction. The upper layer wiring 80 is electrically connected to the plurality of source layers SL juxtaposed to one another along the Y-direction.

The columnar portion CL is provided in the stacked body 100 divided by the dividing portion ST. The columnar portion CL extends in the stacking direction (Z-direction). The columnar portion CL is formed in the shape of a circular column or an elliptic column. The columnar portions CL are disposed in the memory cell array 1 in, for example, a staggered arrangement or a square grid pattern. The drain-side select transistor STD, the plurality of memory cells MC, and the source-side select transistor STS are disposed in the columnar portion CL.

On an upper side of an upper end portion of the columnar portion CL, a plurality of bit lines BL is disposed. The plurality of bit lines BL extends in the Y-direction. The upper end portion of the columnar portion CL is electrically connected to one bit line BL through a contact portion Cb. One bit line is electrically connected to the columnar portion CL selected one by one from each block.

Figure 2:
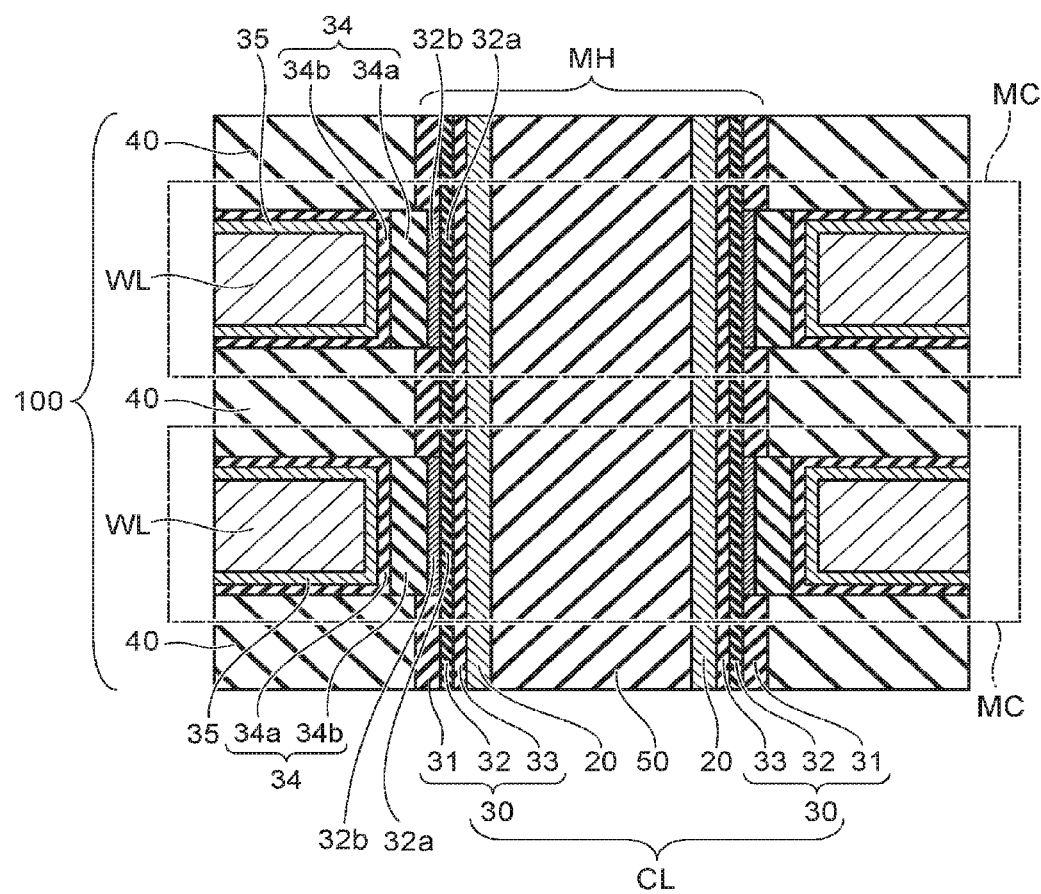
FIG. 2 is a schematic cross-sectional view of the columnar portion of the semiconductor device of the first embodiment.

FIG. 2 is a schematic cross-sectional view of the columnar portion CL of the semiconductor device of the first embodiment. FIG. 2 corresponds to a cross section parallel to a Y-Z plane in FIG. 1. In FIG. 2, a middle part of the columnar portion CL is extracted and shown. In FIG. 2, the memory cell MC is shown.

The columnar portion CL is provided in a memory hole (aperture) MH. The memory hole MH is provided in the stacked body 100. The columnar portion CL includes a memory film 30, a semiconductor body 20, and a core layer 50.

The memory film 30 is provided on an inner wall of the memory hole MH. The shape of the memory film 30 is, for example, a tube. The memory film 30 includes a cover insulating film 31, a charge storage film 32, and a tunnel insulating film 33.

The cover insulating film 31 is provided on the inner wall of the memory hole MH. The cover insulating film 31 of the first embodiment is provided on the insulator 40 exposed on the inner wall of the memory hole MH. The cover insulating film 31 includes, for example, silicon oxide or silicon oxide and aluminum oxide. The cover insulating film 31 protects, for example, the charge storage film 32 from etching when the word line WL is formed.

The charge storage film 32 is provided between each of the electrode layers (SGD, WL, SGS) and the tunnel insulating film 33. In FIG. 2, the charge storage film 32 provided between the word line WL and the tunnel insulating film 33 is shown. The charge storage film 32 of the first embodiment includes a charge trapping layer 32a and a floating electrode layer 32b. The charge trapping layer 32a is provided on the tunnel insulating film 33. The shape of the charge trapping layer 32a is, for example, a tube. The charge trapping layer 32a includes, for example, silicon nitride. The charge trapping layer 32a may include, other than silicon nitride, hafnium oxide. The charge trapping layer 32a includes a trap site for trapping electrical charges in the layer. Electrical charges are trapped at the trap site. The charge trapping layer 32a is a film provided continuously in the stacking direction in the stacked body 100. The floating electrode layer 32b is provided between the charge trapping layer 32a and each of the electrode layers (SGD, WL, SGS). In FIG. 2, the floating electrode layer 32b provided between the charge trapping layer 32a and the word line WL is shown. The floating electrode layer 32b is divided along the stacking direction of the stacked body 100. The floating electrode layer 32b is a film provided corresponding to the plurality of electrode layers (SGD, WL, SGS). For example, the floating electrode layer 32b is provided independently for each memory cell MC. The shape of the floating electrode layer 32b is, for example, a ring. The floating electrode layer 32b includes doped silicon. In the first embodiment, the doped silicon is p-type silicon. The p-type silicon is, for example, boron-doped silicon. The floating electrode layer 32b includes boron at a concentration of, for example, $1 \times 10^{20}$ cm$^{-3}$ or more and $5 \times 10^{21}$ cm$^{-3}$ or less. The floating electrode layer 32b stores electrical charges in the layer. A threshold of the memory cell MC varies depending on the presence or absence of electrical charges trapped and stored in the charge storage film 32 or the amount thereof. According to this, the memory cell MC holds information.

The tunnel insulating film 33 is provided on the charge storage film 32. The tunnel insulating film 33 includes, for example, silicon oxide or silicon oxide and silicon nitride. The tunnel insulating film 33 is a potential barrier between the charge storage film 32 and the semiconductor body 20. An electrical charge tunnels through the tunnel insulating film 33 when an electrical charge is injected from the semiconductor body 20 into the charge storage film 32 (writing operation) and when an electrical charge is diffused from the charge storage film 32 into the semiconductor body 20 (erasing operation).

A block insulating film 34 and a barrier film 35 are provided between each of the electrode layers (SGD, WL, SGS) and the insulator 40 and between each of the electrode layers (SGD, WL, SGS) and the memory film 30. In FIG. 2, the block insulating film 34 and the barrier film 35 provided between the word line WL and the insulator 40 and between the word line WL and the memory film 32 are shown.

The block insulating film 34 of the embodiment includes a first block insulating film 34a and a second block insulating film 34b. The first block insulating film 34a is provided on the floating electrode layer 32b. The first block insulating film 34a includes, for example, silicon oxide or silicon oxide and aluminum oxide. The second block insulating film 34b is provided on the first block insulating film 34a and the insulator 40. The second block insulating film 34b includes, for example, aluminum oxide or aluminum oxide and silicon oxide. The block insulating film 34 suppresses back tunneling of electrical charges from the word line WL to the charge storage film 32 during the erasing operation.

The barrier film 35 is provided on the second block insulating film 34b. The barrier film 35 includes, for example, titanium and titanium nitride.

Each of the electrode layers (SGD, WL, SGS) is provided on the barrier film 35. Each of the electrode layers (SGD, WL, SGS) includes, for example, tungsten. In FIG. 2, the word line WL provided on the barrier film 35 is shown. The block insulating film 34, the barrier film 35, and the electrode layers (SGD, WL, SGS) surround a periphery of the columnar portion CL.

On the memory film 30, the semiconductor body 20 is provided. The semiconductor body 20 includes, for example, silicon. The silicon is, for example, polysilicon obtained by crystallization of amorphous silicon. The conductivity type of the silicon is, for example, p type. The shape of the semiconductor body 20 is, for example, a bottomed tube. The semiconductor body 20 is electrically connected to, for example, the substrate 10.

On the semiconductor body 20, a core layer 50 is provided. The core layer 50 has insulating properties. The core layer 50 includes, for example, silicon oxide. The shape of the core layer 50 is, for example, a column.

In the memory hole MH, the memory film 30, the semiconductor body 20, and the core layer 50 are buried.

FIGS. 3A to 3H are schematic cross-sectional views showing a method for manufacturing the semiconductor device of the first embodiment. Cross sections shown in FIGS. 3A to 3H correspond to the cross section shown in FIG. 2.

Figure 3A:
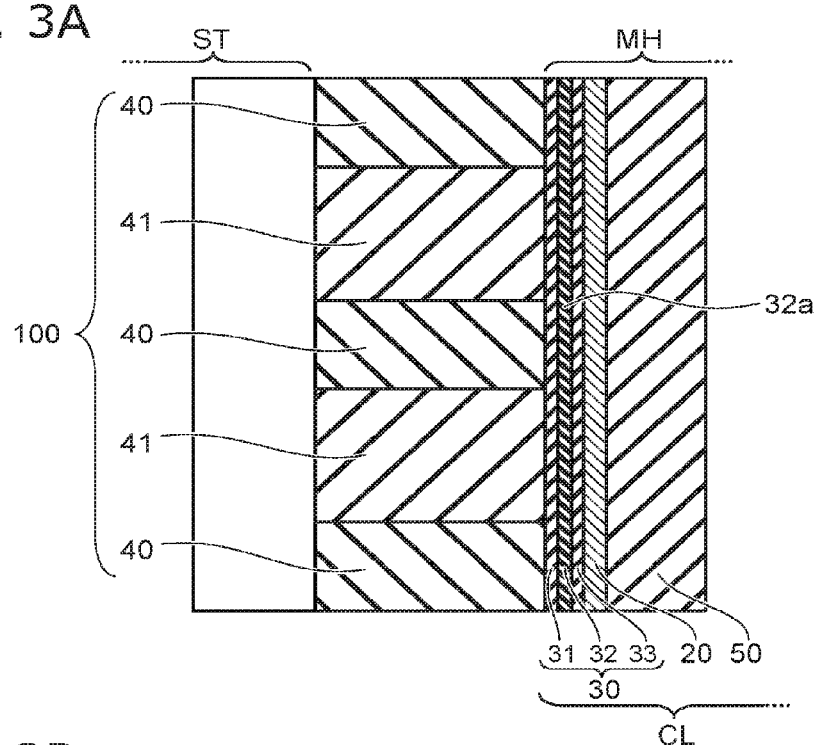

In FIG. 3A, a structure body in which the columnar portion CL is formed in the stacked body 100 and the dividing portion ST is formed in the stacked body 100 is shown. A replacement member 41 is formed between the insulator 40 and the insulator 40 stacked in the vertical direction. The replacement member 41 is a layer which is replaced with any of the electrode layers (SGD, WL, SGS) later. A material of the replacement member 41 is selected from materials which are different from the insulator 40 and can have an etching selection ratio with respect to the insulator 40. For example, when silicon oxide is selected as the insulator 40, silicon nitride is selected as the replacement member 41.

Figure 3B:
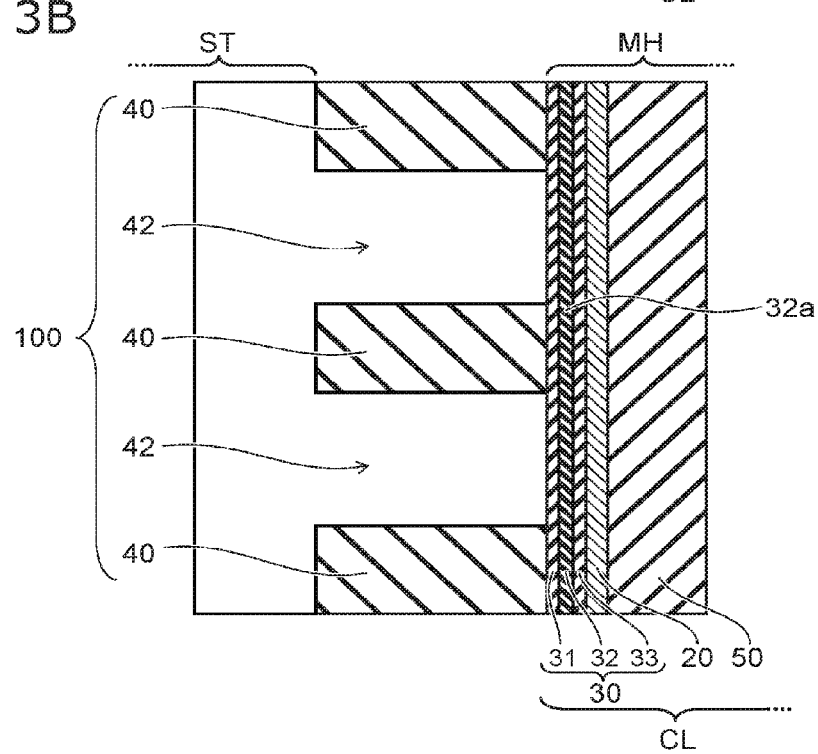

Subsequently, as shown in FIG. 3B, the replacement member 41 is removed from the stacked body 100 through the dividing portion ST. By doing this, a gap 42 is formed between the insulator 40 and the insulator 40.

Subsequently, as shown in FIG. 3C, the cover insulating film 31 is removed from the columnar portion CL through the gap 42. The charge trapping layer 32a, the insulator 40, and the cover insulating film 31 are exposed from the gap 42. In the first embodiment, the charge trapping layer 32a is exposed on the bottom of the gap 42. In the first embodiment, the bottom refers to, for example, a wall on an innermost side when viewed from the opening of the gap 42. In the first embodiment, the bottom of the gap 42 is, for example, along the stacking direction (Z-direction). The insulator 40 and the cover insulating film 31 are exposed on a side wall of the gap 42. In the first embodiment, the side wall spreads in directions (for example, the X-direction and the Y-direction) crossing the stacking direction (Z-direction) and is in contact with the bottom. The charge trapping layer 32a includes silicon nitride. The insulator 40 and the cover insulating film 31 include silicon oxide. According to this, for example, a structure body 42a including an aperture in which the bottom includes silicon nitride (SiN) and the side wall includes silicon oxide ($SiO_2$) is formed in the stacked body 100.

Subsequently, as shown in FIG. 3D, silicon is selectively grown in the aperture of the structure body 42a. In the first embodiment, doped silicon is selectively grown on the charge trapping layer 32a by utilizing the insulator 40 and the cover insulating film 31 including silicon oxide and the charge trapping layer 32a including silicon nitride. The doped silicon is, for example, boron-doped silicon. By doing this, the floating electrode layer 32b including boron-doped silicon is formed on the charge trapping layer 32a. In the first embodiment, the floating electrode layer 32b was formed by a CVD method using, for example, a gas including monosilane ($SiH_4$) and a gas including boron trichloride ($BCl_3$). $SiH_4$ is a silicon source. $BCl_3$ is a boron source. By using such a CVD method, boron-doped silicon was selectively grown to a thickness of, for example, 7 nm on the charge trapping layer 32a. The obtained boron-doped silicon is, for example, amorphous. By doing this, the floating electrode layer 32b with a thickness of, for example, 7 nm is formed on the charge trapping layer 32a.

Figure 3E:
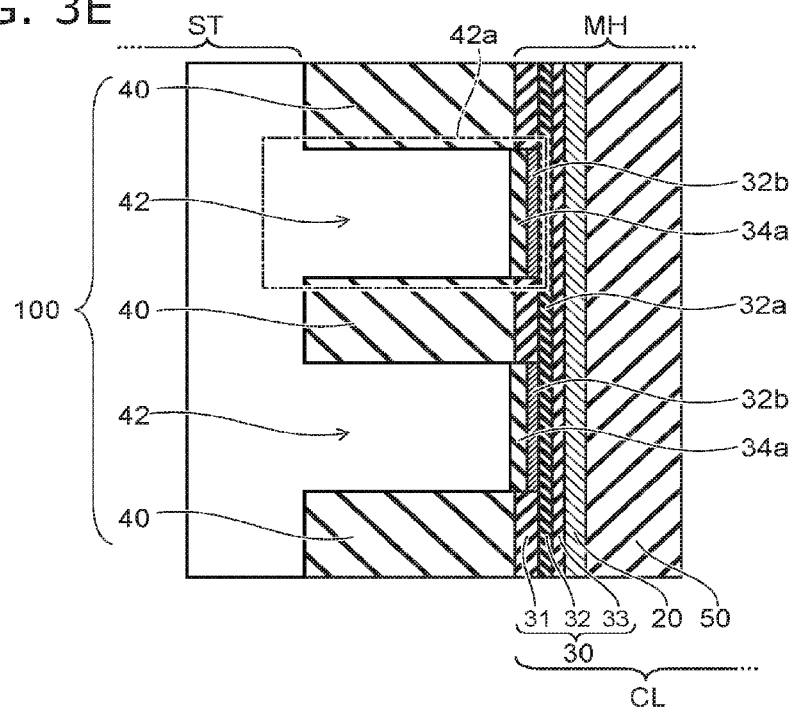

Subsequently, as shown in FIG. 3E, the surface of the floating electrode layer 32b exposed on the bottom of the aperture of the structure body 42a is oxidized. By doing this, the first block insulating film 34a including silicon oxide is formed on the floating electrode layer 32b.

Figure 3F:
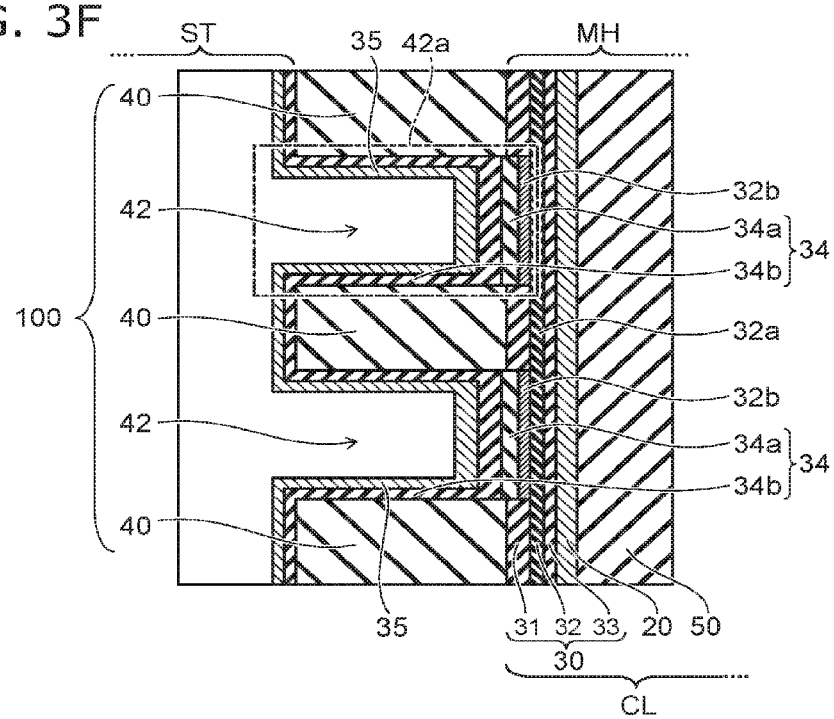

Subsequently, as shown in FIG. 3F, the second block insulating film 34b is formed on, for example, the insulator 40 and the first block insulating film 34a. The second block insulating film 34b includes, for example, aluminum oxide. The aluminum oxide is, for example, alumina ($Al_2O_3$). Subsequently, the barrier film 35 is formed on the second block insulating film 34b. The barrier film 35 includes, for example, titanium and titanium nitride. The barrier film 35 is formed by forming a titanium layer on the second block insulating film 34b and forming a titanium nitride layer on the titanium layer.

Figure 3G:
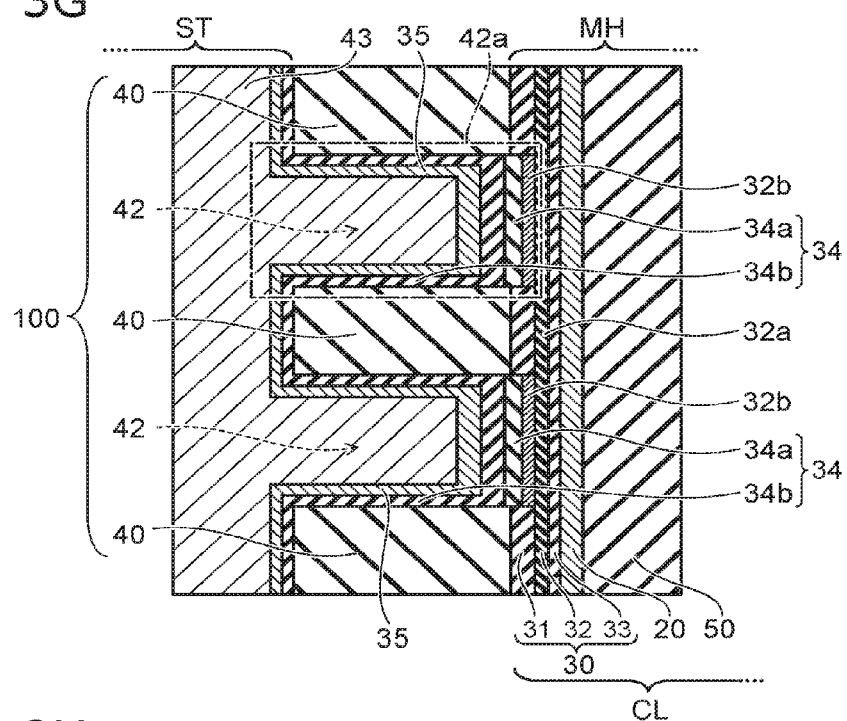

Subsequently, as shown in FIG. 3G, a conductive material 43 is buried in the dividing portion ST and the gap 42. The conductive material 43 includes, for example, tungsten.

Figure 3H:
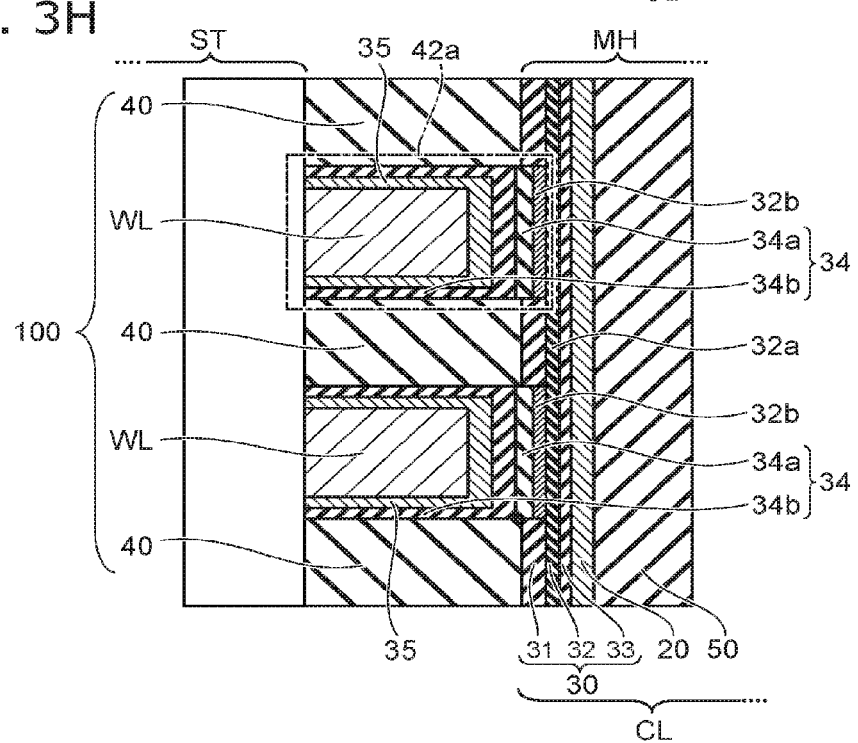

Subsequently, as shown in FIG. 3H, the conductive material 43 is etched, and the conductive material 43 is left in the gap 42. By doing this, each of the electrode layers (SGD, WL, SGS) is formed between the insulator 40 and the insulator 40. In FIG. 3H, the word line WL is shown.

The semiconductor device of the first embodiment can be manufactured by, for example, the manufacturing method as described above.

Figure 4:
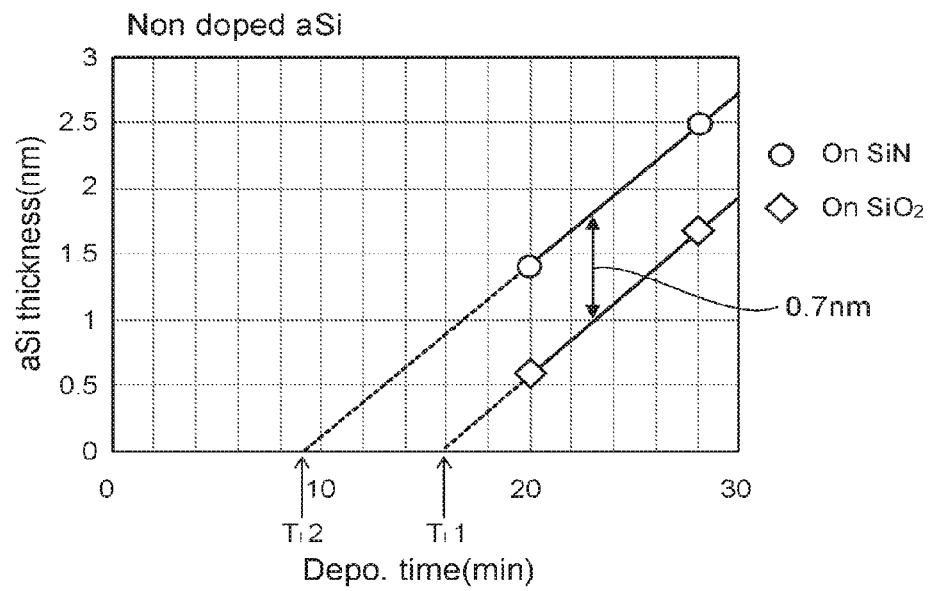
FIGS. 4 and 5 are views showing a relationship between a deposition time and a thickness of amorphous silicon.
Figure 5:
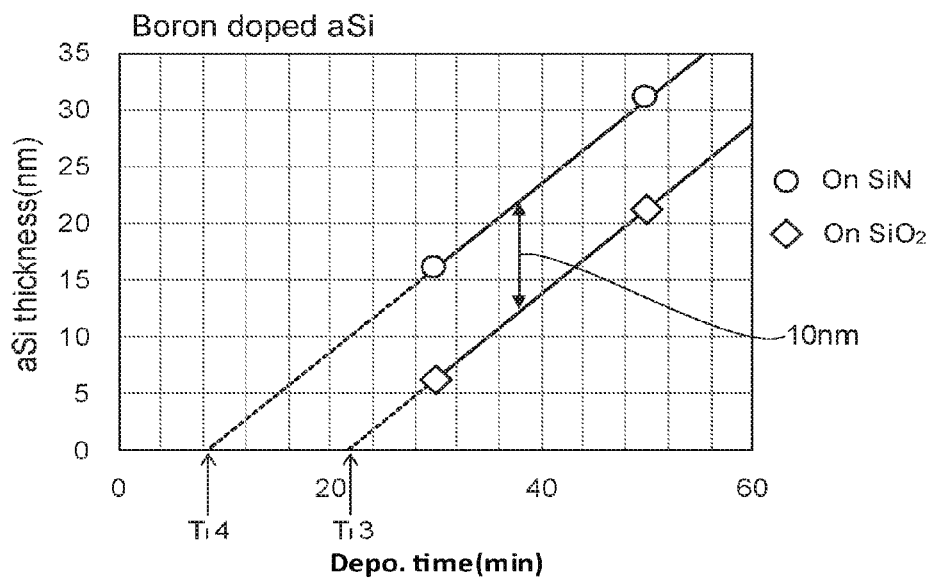

FIGS. 4 and 5 are views showing a relationship between a deposition time (Depo. time) and a thickness of amorphous silicon (aSI). FIG. 4 shows a case of non-doped amorphous silicon. FIG. 5 shows a case of boron-doped amorphous silicon. The silicon source gas is $SiH_4$. The boron source gas is $BCl_3$.

As shown in FIG. 4, when the deposition time is set to 20 minutes, the non-doped aSi is grown to a thickness of about 0.6 nm on $SiO_2$ and to a thickness of about 0.13 nm on SiN. A difference in thickness is about 0.7 nm. An incubation time $T_i1$ of the non-doped aSi on $SiO_2$ is about 14 to 16 min. An incubation time $T_i2$ of the non-doped aSi on SiN is about 8 to 10 min.

As shown in FIG. 5, when the deposition time is set to 30 minutes, the boron-doped aSi is grown to a thickness of about 7 nm on $SiO_2$ and to a thickness of about 17 nm on SiN. A difference in thickness is about 10 nm. An incubation time $T_i3$ of the boron-doped aSi on $SiO_2$ is about 21 to 23 min. An incubation time $T_i4$ of the boron-doped aSi on SiN is about 8 to 10 min.

For example, the floating electrode layer 32b with a thickness of 7 nm is selectively grown on the charge trapping layer 32a. When non-doped aSi is used for the floating electrode layer 32b, a process cycle including a "deposition step" and an "etching step" is repeated. For example, the "deposition step" is stopped at around the incubation time of $T_i1$ when silicon starts to grow on $SiO_2$. Subsequently, in the "etching step", a silicon layer grown on the insulator 40 and the cover insulating film 31 is removed. Such a cycle is repeated, for example, 10 times or more. Due to this, it takes time for forming the floating electrode layer 32b.

On the other hand, when boron-doped aSi is used for the floating electrode layer 32b as in the first embodiment, only the "deposition step" suffices. For example, the "deposition step" is stopped at, for example, 20 minutes. This time is a time less than the incubation time of T$_f$3 when silicon starts to grow on SiO$_2$. Due to this, the silicon layer is not grown on the insulator 40 and the cover insulating film 31. However, the silicon layer with a thickness of about 7 nm is grown on the charge trapping layer 32a. The floating electrode layer 32b is formed without undergoing the "etching step". Therefore, in the first embodiment, the time required for forming the floating electrode layer 32b can be reduced as compared with the case where non-doped aSi is used for the floating electrode layer 32b.

Figure 6:
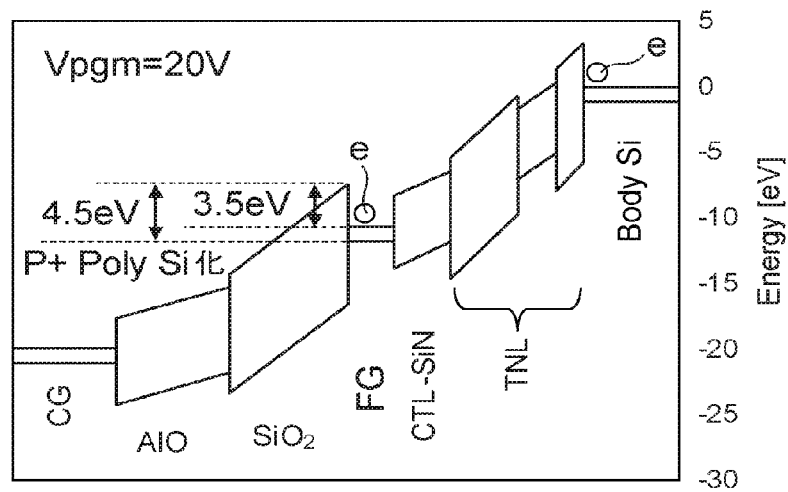
FIGS. 6 to 8 are band diagrams of the memory cell of the semiconductor device of the first embodiment.
Figure 7:
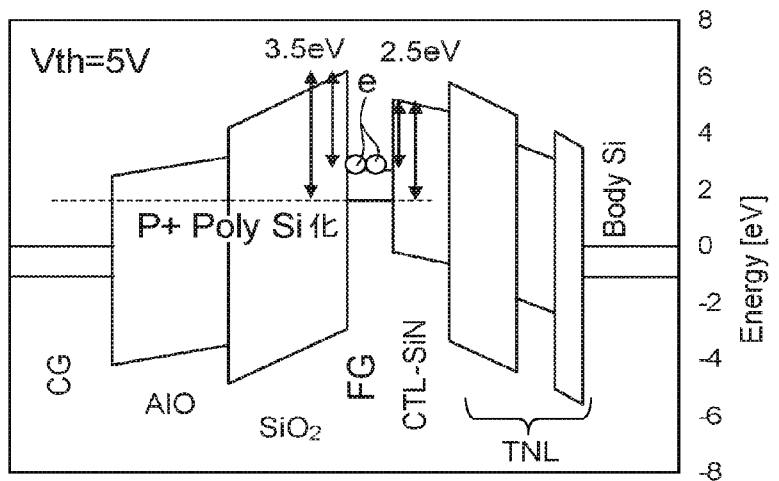
Figure 8:
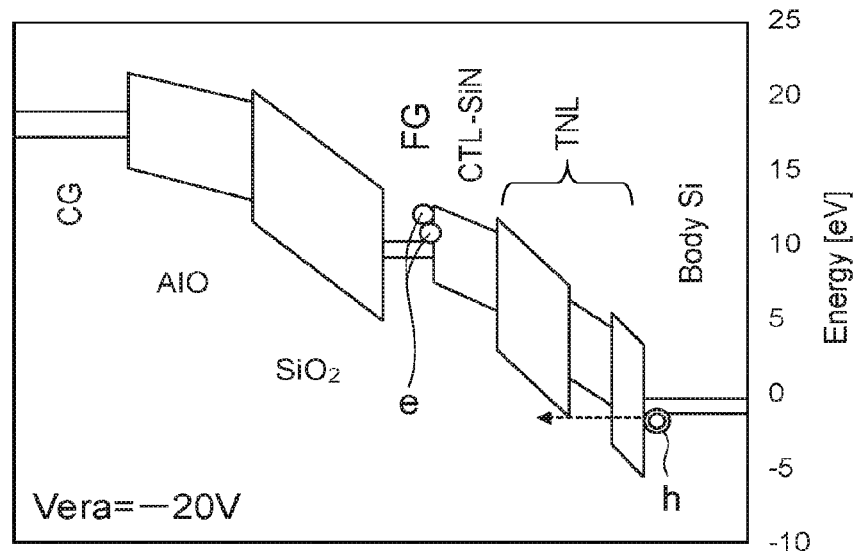

FIGS. 6 to 8 are band diagrams of the memory cell of the semiconductor device of the first embodiment. FIG. 6 is an energy band diagram during a writing operation. FIG. 7 is an energy band diagram during a holding state. FIG. 8 is a band diagram during an erasing operation. In FIGS. 6 to 8, "CG" denotes any of the electrode layers (SGD, WL, SGS); "AlO" denotes the second block insulating film 34b; "SiO$_2$" denotes the first block insulating film 34a; "FG" denotes the floating electrode layer 32b; "CTL-SiN" denotes the charge trapping layer 32a; "TNL" denotes the tunnel insulating film 33; and "Body Si" denotes the semiconductor body 20.

During the writing operation, as shown in FIG. 6, in the first embodiment, a deep potential well is formed in the floating electrode layer (FG) 32b between the first block insulating film (SiO$_2$) 34a and the charge trapping layer (CTL-SiN) 32a. In the first embodiment, the floating electrode layer (FG) 32b includes p-type silicon, for example, boron-doped silicon. Due to this, a barrier height between the floating electrode layer (FG) 32b and the first block insulating film (SiO$_2$) 34a is increased to, for example, about 3.5 eV.

When the charge trapping layer (CTL-SiN) 32a is in direct contact with the first block insulating film (SiO$_2$) 34a, a barrier height between the charge trapping layer (CTL-SiN) 32a and the first block insulating film (SiO$_2$) 34a is about 1.0 eV.

Due to this, according to the first embodiment, an electron e is easily trapped during the writing operation. Further, the generation of a through current from the semiconductor body 20 to the word line WL can be suppressed. Therefore, according to the first embodiment, the writing characteristics of the memory cell MC are improved.

During the holding state, as shown in FIG. 7, in the first embodiment, a barrier height between the floating electrode layer (FG) 32b and the first block insulating film (SiO$_2$) 34a is, for example, about 3.5 eV. A barrier height between the floating electrode layer (FG) 32b and the charge trapping layer (CTL-SiN) 32a is, for example, about 2.5 eV. In the floating electrode layer (FG) 32b, an electron e is covered by a barrier wall of about 2.5 to 3.5 eV.

When the charge trapping layer (CTL-SiN) 32a is in direct contact with the first block insulating film (SiO$_2$) 34a, a barrier height between the charge trapping layer (CTL-SiN) 32a and the tunnel insulating film (TNL) 33 is about 1.0 eV. A barrier height between the charge trapping layer (CTL-SiN) 32a and the first block insulating film (SiO$_2$) 34a is also about 1.0 eV. A depth of a trapping potential of the charge trapping layer (CTL-SiN) 32a is about 1.0 eV. At the trapping potential of the charge trapping layer (CTL-SiN) 32a, an electron e is covered by a barrier wall of about 2.0 eV (=about 1.0 eV+about 1.0 eV). The barrier wall is lower than that of the first embodiment.

Therefore, according to the first embodiment, the charge holding characteristics of the memory cell MC are improved.

During the erasing operation, as shown in FIG. 8, also in the first embodiment, the erasure of information is performed by injecting a hole h from the semiconductor body (Body-Si) 20. Therefore, also in the first embodiment, information can be erased in the same manner as in the case where the charge trapping layer (CTL-SiN) 32a is in direct contact with the first block insulating film (SiO$_2$) 34a.

As described above, according to the first embodiment, the electrical characteristics of the memory cell MC can be further improved.

Figure 9:
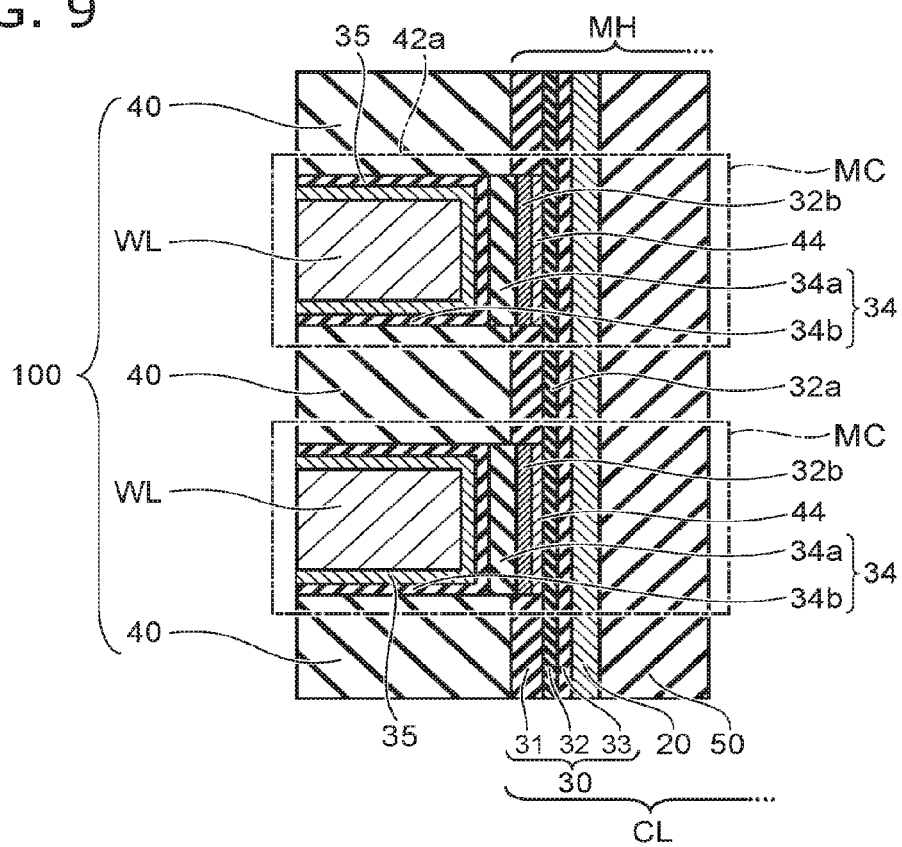
FIG. 9 is a schematic cross-sectional view of a columnar portion of a semiconductor device of a second embodiment.

FIG. 9 is a schematic cross-sectional view of a columnar portion of a semiconductor device of a second embodiment. FIG. 9 corresponds to the cross section shown in FIG. 2. In FIG. 9, a middle part of a columnar portion CL is extracted and shown. In FIG. 9, a memory cell MC is shown.

As shown in FIG. 9, the second embodiment is different from the first embodiment in that a seed layer 44 is provided between the floating electrode layer 32b and the charge trapping layer 32a. The seed layer 44 includes silicon. The silicon may be, for example, p-type silicon. A p-type carrier is, for example, boron. The seed layer 44 becomes a part of the floating electrode layer 32b.

Figure 10A:
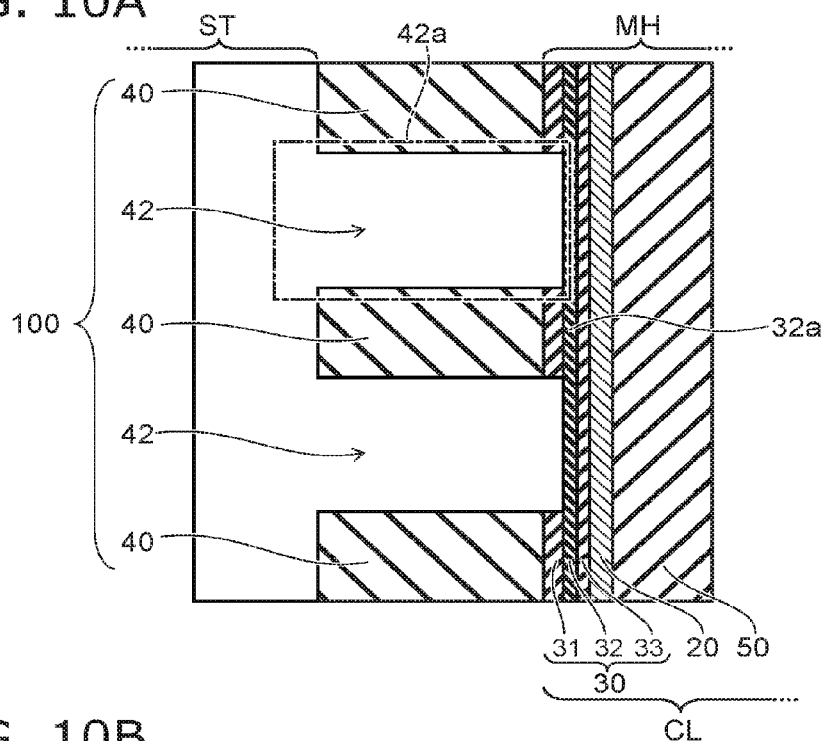
FIG. 10A to FIG. 10C are schematic cross-sectional views showing the method for manufacturing the semiconductor device of the second embodiment.
Figure 10B:
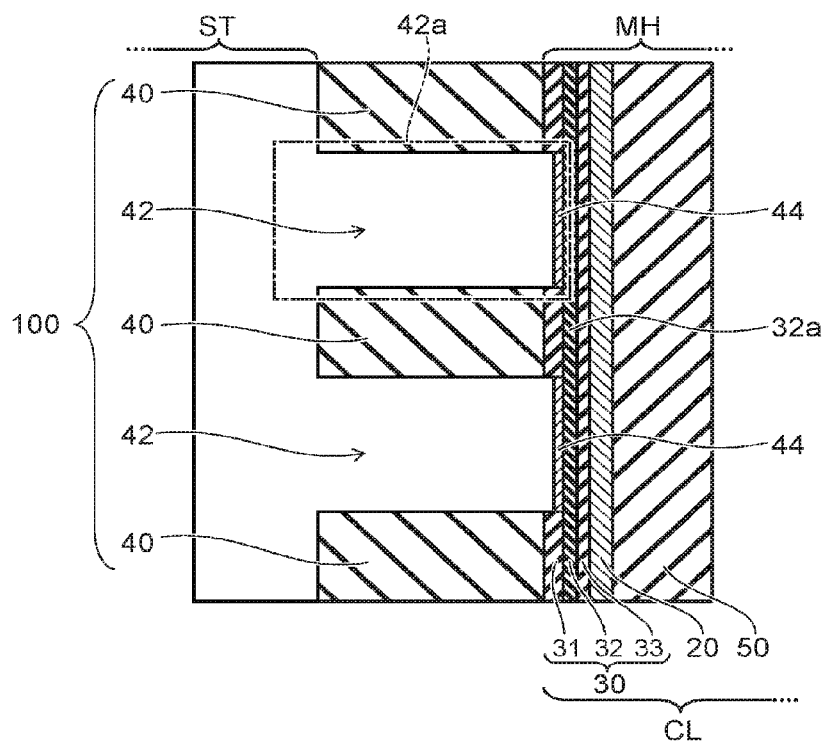
Figure 10C:
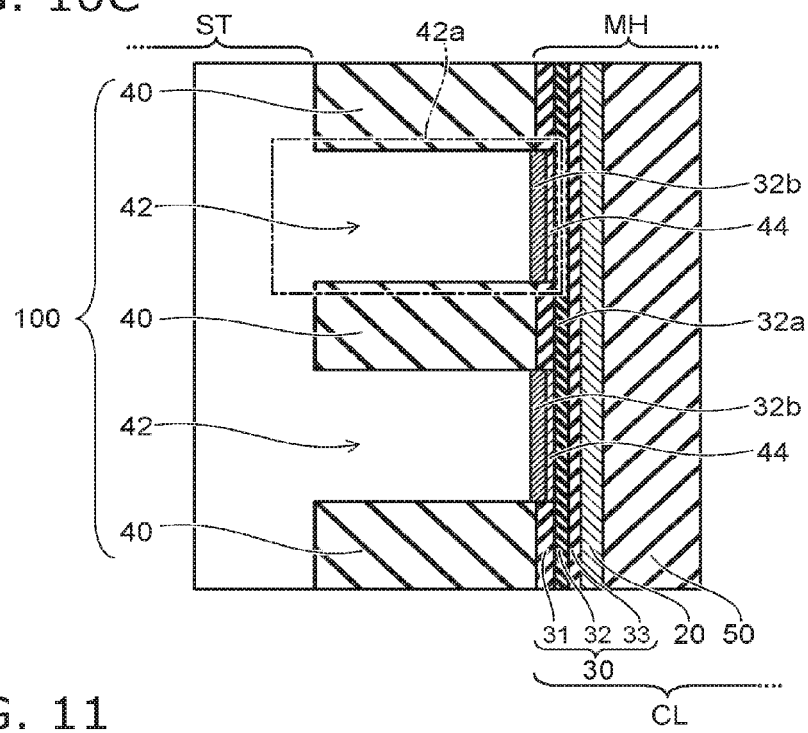
Figure 11:
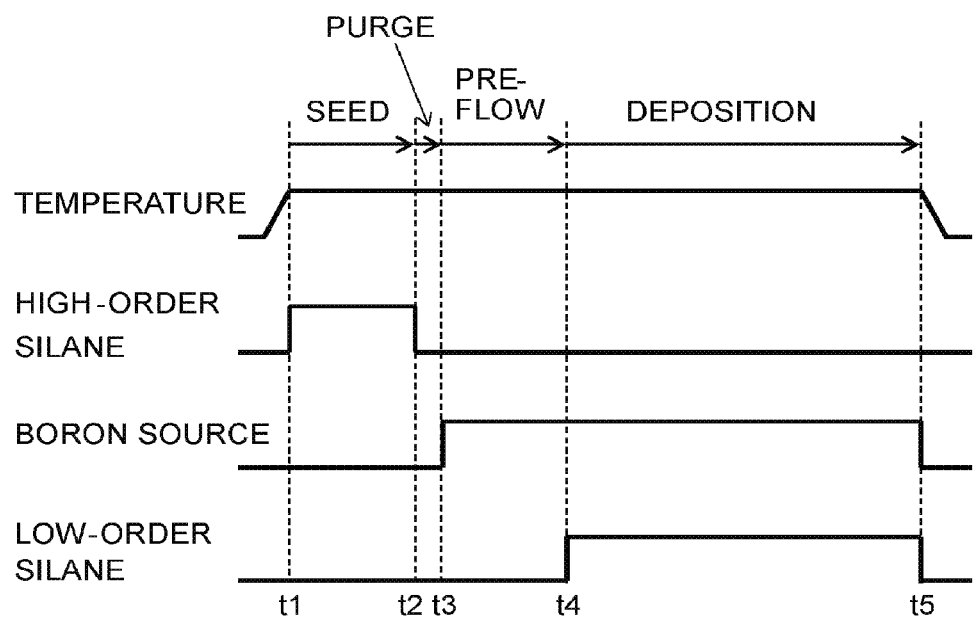
FIG. 11 is a timing chart of a process for forming the floating electrode layer.

FIGS. 10A to 10C are schematic cross-sectional views showing a method for manufacturing the semiconductor device of the second embodiment. Cross sections shown in FIGS. 10A to 10C correspond to the cross section shown in FIG. 9. FIG. 11 is a timing chart of a process for forming the floating electrode layer.

As shown in FIG. 10A, a structure body 42a and a stacked body 100 are formed according to, for example, the manufacturing method described with reference to FIGS. 3A to 3C.

Subsequently, a substrate 10 including the stacked body 100 is transported into a processing chamber of a film deposition device (not shown). After the substrate 10 is transported into the processing chamber, as shown in FIG. 11, a temperature in the processing chamber is increased to a film deposition processing temperature. The film deposition processing temperature may be, for example, equal to or higher than a temperature at which, for example, a silicon source gas to be used for the processing is thermally decomposed. As shown at a time t1, when the temperature in the processing chamber reaches the film deposition processing temperature, a high-order silane gas is supplied into the processing chamber. By doing this, the high-order silane gas is supplied to a charge trapping layer 32a exposed on a bottom of the structure body 42a. The high-order silane gas is, for example, a gas including a silicon-hydrogen compound having an order that is equal to or higher than that of disilane. In the second embodiment, a gas including disilane (Si$_2$H$_6$) was used. By doing this, as shown in FIG. 10B, the seed layer 44 is formed on the charge trapping layer 32a in the structure body 42a (SEED).

Subsequently, as shown at a time t2, the supply of the high-order silane gas is stopped. Then, an inert gas, for example, nitrogen gas is supplied into the processing chamber while evacuating the inside of the processing chamber. By doing this, an atmosphere in the processing chamber is purged (PURGE).

Subsequently, as shown at a time t3, a boron source gas is supplied into the processing chamber. In the second embodiment, as the boron source, a gas including boron trichloride (BCl$_3$) was used. This step is performed for, for example, apply boron to the seed layer 44 (PRE-FLOW). This step may not be performed.

Subsequently, as shown at a time t4, a low-order silane gas is supplied into the processing chamber. By doing this, the low-order silane gas is supplied to the seed layer 44 formed on the bottom of the structure body 42a. The low-order silane gas includes silane having an order that is lower than that of the high-order silane used in the step of forming the seed layer. In the second embodiment, a gas including monosilane (SiH$_4$) was used. By doing this, as shown in FIG. 10C, the floating electrode layer 32b is formed on the seed layer 44 (DEPOSITION).

Subsequently, as shown at a time t5, the supply of the low-order silane gas and the boron source gas is stopped, and the temperature in the processing chamber is decreased.

Thereafter, manufacturing may be performed according to the manufacturing method described with reference to FIGS. 3E to 3H.

The semiconductor device of the second embodiment can be manufactured by, for example, the manufacturing method as described above.

Figure 12:
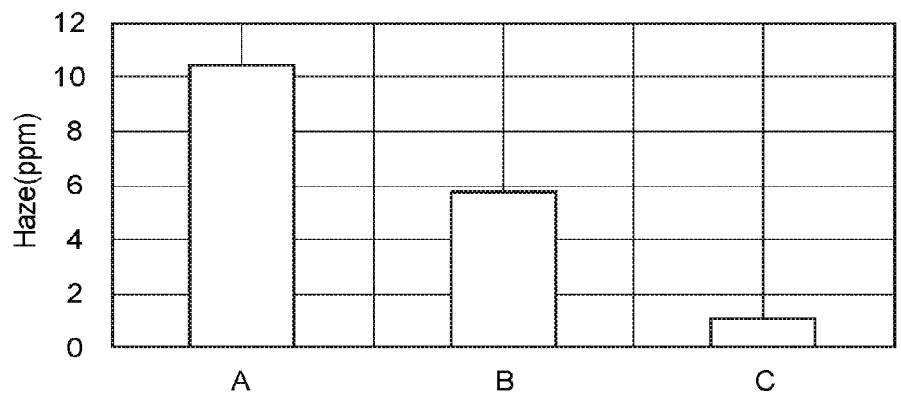
FIG. 12 is a view showing a haze of a surface of a silicon film.

FIG. 12 is a view showing a haze of a surface of a silicon film. In the measurement of the haze, a light scattering measurement device was used. The wavelength of light used in the measurement is about 633 nm. The surface of the silicon film was irradiated with light with a wavelength of about 633 nm, and a scattered light intensity was measured. When a haze level is high, the surface irregularities of the silicon film are large and the surface is in a roughened state. As the haze level is decreased, the surface of the silicon film is smoother. The silicon film was formed on, for example, a silicon nitride film. The silicon source gas is a gas including SiH$_4$, and the boron source gas is a gas including BCl$_3$.

As shown in FIG. 12, when boron-doped silicon is deposited directly on, for example, the silicon nitride film, as shown by a sample A, the haze level is increased. When non-doped silicon is deposited directly on the silicon nitride film, as shown by a sample B, the haze level is lower than that of the sample A.

When boron-doped silicon is deposited on, for example, a silicon nitride film after making a gas including disilane to supply, as shown by a sample C, the haze level is lower than that of the sample B.

In the second embodiment, the floating electrode layer 32b is provided on the seed layer 44. Due to this, as compared with the case where the seed layer 44 is not provided, the surface of the floating electrode layer 32b can be made smoother. When the surface of the floating electrode layer 32b becomes smooth, for example, a thickness fluctuation of the first block insulating film 34a is decreased. When the thickness fluctuation of the first block insulating film 34a is decreased, the charge blocking characteristics of the first block insulating film 34a are improved.

Therefore, according to the second embodiment, the first block insulating film 34a having excellent charge blocking characteristics can be obtained, and the electrical characteristics of the memory cell MC are further improved as compared with the first embodiment.

In the second embodiment, as the gas for forming the seed layer 44, a gas including a high-order silane including "2" or more silicon atoms (for example, disilane) was used. As the gas for forming the seed layer 44, other than the gas including a high-order silane, for example, a gas including a silicon hydride including nitrogen and carbon may be used. One example of the silicon hydride including nitrogen and carbon is, for example, diisopropylaminosilane. Also in the silicon hydride including nitrogen and carbon, the number of silicon atoms may be "2" or more.

Figure 13:
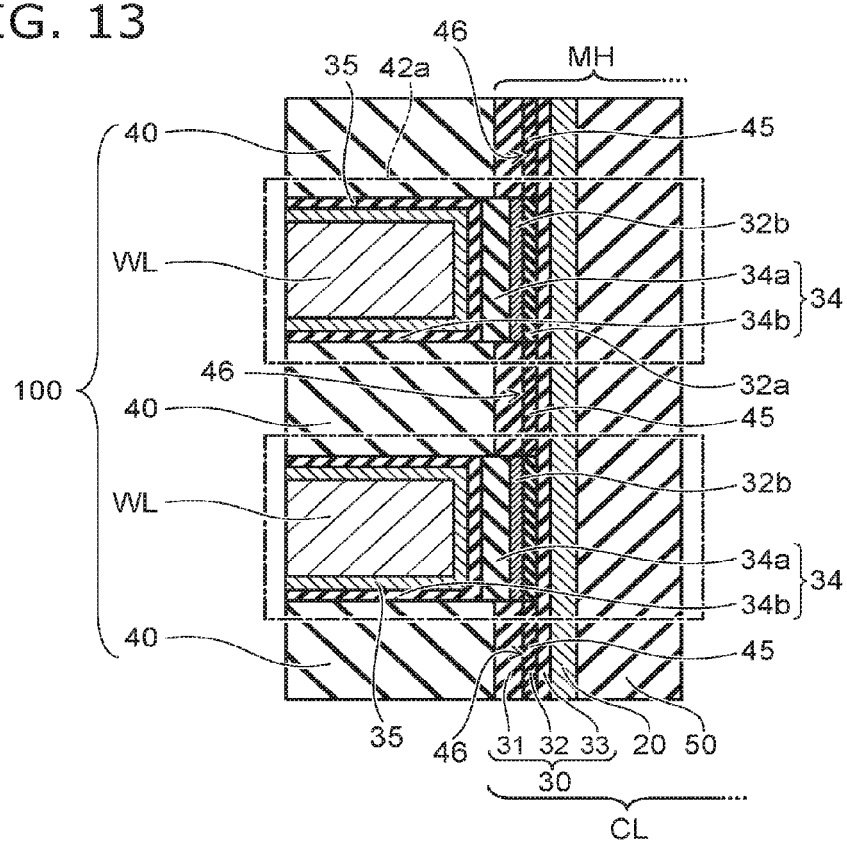
FIG. 13 is a schematic cross-sectional view of a columnar portion of a semiconductor device of a third embodiment.

FIG. 13 is a schematic cross-sectional view of a columnar portion of a semiconductor device of a third embodiment. FIG. 13 corresponds to the cross section shown in FIG. 2. In FIG. 13, a middle part of a columnar portion CL is extracted and shown. In FIG. 13, a memory cell MC is shown.

As shown in FIG. 13, the third embodiment is different from the first embodiment in that an insulating film 45 is provided on the charge trapping layer 32a. The insulating film 45 includes silicon oxide. The insulating film 45 is provided in a first portion 46 of the charge trapping layer 32a. The first portion 46 is present on a lower side between the floating electrode layer 32b and the floating electrode layer 32b. In the third embodiment, also the charge trapping layer 32a is separated by the insulating film 45 for each memory cell MC in the same manner as the floating electrode layer 32b. The insulating film 45 blocks the transfer of electrical charges between the adjacent memory cells MC through the charge trapping layer 32a.

Therefore, according to the third embodiment, as compared with the first embodiment, for example, the charge holding characteristics are further enhanced.

FIGS. 14A and 14B are schematic cross-sectional views showing a method for manufacturing the semiconductor device of the third embodiment. Cross sections shown in FIGS. 14A and 14B correspond to the cross section shown in FIG. 13.

As shown in FIG. 14A, a floating electrode layer 32b is formed on a charge trapping layer 32a according to, for example, the manufacturing method described with reference to FIG. 3A or 3D.

Subsequently, as shown in FIG. 14B, by using a radical oxidation method, a surface of the floating electrode layer 32b exposed on a bottom of an aperture of a structural body 42a is oxidized. At this time, oxygen radical O* proceeds in an insulator 40 and a cover insulating film 31 while replacing oxygen included in the insulator 40 and the cover insulating film 31. Further, when oxygen radical O* reaches, for example, a charge trapping layer 32a through the cover insulating film 31, the oxygen radical O* replaces nitrogen included in the charge trapping layer 32a. The replaced nitrogen is converted to, for example, a nitrogen oxide NOx and is volatilized. Due to this, the charge trapping layer 32a is converted to silicon oxide from a portion in contact with the cover insulating film 31. By doing this, an insulating film 45 is formed in the first portion 46. In a portion of the charge trapping layer 32a in contact with the floating electrode layer 32b, oxygen radical O* is consumed by oxidization of the floating electrode layer 32b, and therefore, as compared with the portion in contact with the cover insulating film 31, the conversion to silicon oxide is suppressed.

Thereafter, manufacturing may be performed according to the manufacturing method described with reference to FIGS. 3F to 3H.

The semiconductor device of the third embodiment can be manufactured by, for example, the manufacturing method as described above.

The third embodiment can also be combined with the second embodiment.

Figure 15:
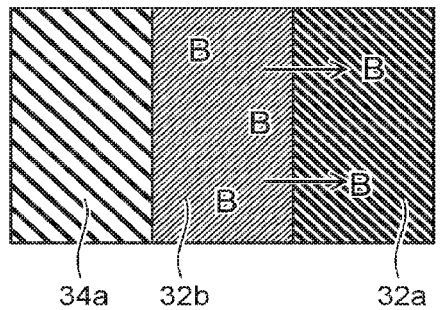
FIG. 15 is a schematic cross-sectional view of a semiconductor device of a fourth embodiment.

FIG. 15 is a schematic cross-sectional view of a semiconductor device of a fourth embodiment. FIG. 15 shows a floating electrode layer 32b and therearound.

As shown in FIG. 15, in the charge trapping layer 32a, a p-type carrier, for example, boron (B) may be included. Boron (B) in the charge trapping layer 32a is boron (B) dispersed from, for example, the floating electrode layer 32b.

Figure 16:
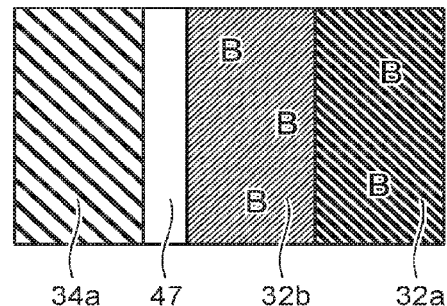
FIG. 16 is a schematic cross-sectional view of a semiconductor device of a fifth embodiment.

FIG. 16 is a schematic cross-sectional view of a semiconductor device of a fifth embodiment. FIG. 16 shows a floating electrode layer 32b and therearound.

As shown in FIG. 16, the fifth embodiment is different from the first embodiment in that a non-doped silicon layer 47 is provided between the floating electrode layer 32b and a first block insulating film 34a. The non-doped silicon layer 47 suppresses the diffusion of boron (B) from the floating electrode layer 32b into the first block insulating film 34a. If boron (B) diffuses into the first block insulating film 34a, the charge blocking characteristics of the first block insulating film 34a is deteriorated. The non-doped silicon layer 47 suppresses the deterioration of the charge blocking characteristics.

Therefore, according to the fifth embodiment, the electrical characteristics of the memory cell MC are further improved as compared with the first embodiment.

Figure 17:
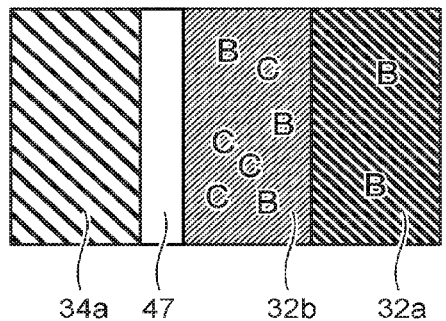
FIG. 17 is a schematic cross-sectional view of a semiconductor device of a sixth embodiment.

FIG. 17 is a schematic cross-sectional view of a semiconductor device of a sixth embodiment. FIG. 17 shows a floating electrode layer 32b and therearound.

As shown in FIG. 17, the sixth embodiment is different from the fifth embodiment in that carbon (C) is further included in the floating electrode layer 32b. Carbon (C) suppresses the transfer of boron (B) included in the floating electrode layer 32b.

Due to this, in the sixth embodiment, boron (B) is made difficult to diffuse from the floating electrode layer 32b.

Therefore, also in the sixth embodiment, the deterioration of the charge blocking characteristics of a first block insulating film 34a can be suppressed.

Carbon (C) can be included in the floating electrode layer 32b by further supplying a carbon source gas into a processing chamber when the floating electrode layer 32b is formed. The carbon source gas is, for example, a gas including ethylene ($C_2H_4$).

Figure 18:
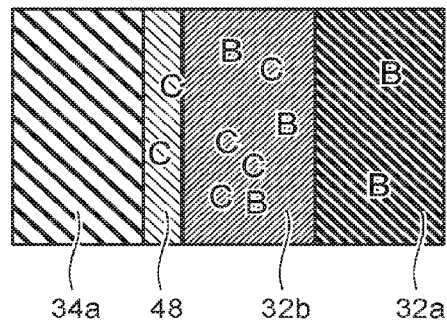
FIG. 18 is a schematic cross-sectional view of a semiconductor device of a seventh embodiment.

FIG. 18 is a schematic cross-sectional view of a semiconductor device of a seventh embodiment. FIG. 18 shows a floating electrode layer 32b and therearound.

As shown in FIG. 18, the seventh embodiment is different from the first embodiment in that a carbon-doped silicon layer 48 is provided between the floating electrode layer 32b and a first block insulating film 34a. In the seventh embodiment, carbon (C) is further included also in the floating electrode layer 32b.

As in the seventh embodiment, even if the carbon-doped silicon layer 48 is provided, the diffusion of boron (B) included in the floating electrode layer 32b into, for example, the first block insulating film 24a can be suppressed. Also in the seventh embodiment, the deterioration of the charge blocking characteristics of the first block insulating film 34a can be suppressed.

Figure 19:
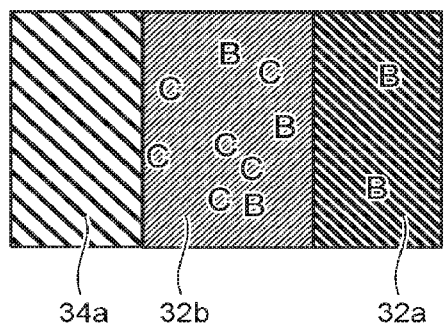
FIG. 19 is a schematic cross-sectional view of a semiconductor device of an eighth embodiment.

FIG. 19 is a schematic cross-sectional view of a semiconductor device of an eighth embodiment. FIG. 19 shows a floating electrode layer 32b and therearound.

As shown in FIG. 19, the eighth embodiment is different from the first embodiment in that the floating electrode layer 32b includes boron (B) and carbon (C).

As in the eighth embodiment, also by including boron (B) and carbon (C) in the floating electrode layer 32b, the diffusion of boron (B) included in the floating electrode layer 32b can be suppressed.

In the eighth embodiment, it is also possible to change the content of carbon (C) and the content of boron (B) in the floating electrode layer 32b. For example, in the floating electrode layer 32b, the content of carbon (C) may be set higher than the content of boron (B) on a side of a first block insulating film 34a. Also in the eighth embodiment, the deterioration of the charge blocking characteristics of the first block insulating film 34a can be suppressed.

As described above, according to the embodiments, the electrical characteristics of the memory cell can be improved.

Further, in the embodiments, the memory device having a three-dimensional structure has been illustrated, however, the device may be a planar memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a semiconductor layer;
an electrode layer;
a first insulating film provided between the electrode layer and the semiconductor layer;
a charge storage film provided between the first insulating film and the electrode layer, the charge storage film including a charge trapping layer and a floating electrode layer, the floating electrode layer including doped silicon; and
a second insulating film provided between the floating electrode layer and the electrode layer,
wherein the doped silicon includes boron, and
wherein the charge trapping layer includes boron.

2. The device according to claim 1, wherein the doped silicon includes boron at a concentration of $1\times10^{20}$ cm$^{-3}$ or more and $5\times10^{21}$ cm$^{-3}$ or less.

3. A semiconductor device, comprising:
a semiconductor layer;
a stacked body including a plurality of electrode layers, the electrode layers stacked on one another;
a first insulating film provided between the electrode layers and the semiconductor layer;
a charge storage film provided between the first insulating film and the electrode layers, the charge storage film including a charge trapping layer and a floating electrode layer, the floating electrode layer including doped silicon; and
a second insulating film provided between the floating electrode layer and the electrode layers, wherein
the charge trapping layer is a film provided continuously on the electrode layers in a stacking direction of the stacked body, and
the floating electrode layer is a film divided in the stacking direction of the stacked body and provided corresponding to the respective electrode layers.

4. The device according to claim 3, comprises a silicon layer different from the doped silicon between the floating electrode layer and the charge trapping layer, wherein the silicon layer is a seed layer.

5. The device according to claim 3, comprises a non-doped silicon layer different from the doped silicon between the second insulating film and the floating electrode layer.

6. The device according to claim 3, comprises a carbon-doped silicon layer different from the doped silicon between the second insulating film and the floating electrode layer.

7. The device according to claim 1, wherein the doped silicon further includes carbon.

8. The device according to claim 7, wherein a carbon content of the doped silicon is higher than an boron content of the doped silicon on a side of the second insulating film.

9. A semiconductor device, comprising:
a semiconductor layer;
a first electrode layer provided on the semiconductor layer;
a second electrode layer provided on the semiconductor layer, the second electrode layer separated from the first electrode layer;
a first insulating film provided between the first electrode layer and the semiconductor layer, and between the second electrode layer and the semiconductor layer;
a charge storage film provided between the first insulating film and the first electrode layer, and between the first insulating film and the second electrode layer, the charge storage film including a charge trapping layer, a first floating electrode layer, and a second floating electrode layer, the charge trapping layer provided between the first insulating film and the first electrode layer, and between the first insulating film and the second electrode layer, the first floating electrode layer provided between the charge trapping layer and the first electrode layer, the second floating electrode layer provided between the charge trapping layer and the second electrode layer, the first floating electrode layer including first doped silicon, and the second floating electrode layer including second doped silicon;
a second insulating film provided between the first floating electrode layer and the first electrode layer;
a third insulating film provided between the second floating electrode layer and the second electrode layer; and
a fourth insulating film provided between the first floating electrode layer and the second floating electrode layer, and between the first electrode layer and the second electrode layer.

10. The device according to claim 9, wherein the first doped silicon and the second doped silicon include boron.

11. The device according to claim 9, wherein
a first portion of the charge trapping layer is present on a lower side between the first floating electrode layer and the second floating electrode layer, and
a fifth insulating film is provided in the first portion.

12. The device according to claim 11, wherein
the charge trapping layer includes silicon nitride, and
the fifth insulating film includes silicon oxide.

* * * * *